United States Patent [19]

Fujita

[11] 4,015,096

[45] Mar. 29, 1977

[54] CHANGE-OVER SWITCH MECHANISM FOR PUSH-BUTTON TUNER

[75] Inventor: Kazumasa Fujita, Iwaki, Japan

[73] Assignee: Motorola, Inc., Schaumburg, Ill.

[22] Filed: Aug. 29, 1975

[21] Appl. No.: 608,863

[30] Foreign Application Priority Data

Aug. 31, 1974 Japan ............. 49-104619[U]

[52] U.S. Cl. ................. 200/156; 200/18; 334/53; 338/198

[51] Int. Cl.² .................... H01H 19/18

[58] Field of Search ............ 200/4, 18, 156, 153 T, 200/330, 331; 334/7, 53, 54; 338/172, 198, 200

[56] References Cited

UNITED STATES PATENTS

| 3,166,714 | 1/1965 | Hien ............................ 200/156 |
| 3,438,662 | 4/1969 | Cowal ........................... 200/331 |
| 3,602,051 | 8/1971 | Olah ............................. 334/7 |
| 3,618,404 | 11/1971 | Tyzack .......................... 334/7 |
| 3,697,921 | 10/1972 | Urwin ........................... 338/172 |
| 3,906,806 | 9/1975 | Harlan ........................... 334/7 |
| 3,912,896 | 10/1975 | Imamura ........................ 334/54 |
| 3,924,220 | 12/1975 | Matsui .......................... 200/330 |

*Primary Examiner*—Gerald P. Tolin
*Attorney, Agent, or Firm*—James W. Gillman; Donald J. Lisa; Phillip H. Melamed

[57] ABSTRACT

A change-over mechanism for a pushbutton radio tuner is disclosed. The mechanism has a tuning shaft which transmits rotational movement to a pinion shaft in engagement with a crown gear. The tuning shaft is slidably and rotatably mounted on a frame body. The sliding movement of the tuning shaft enables a switch to be changed-over while the rotational movement enables a tuning operation to be effected.

8 Claims, 4 Drawing Figures

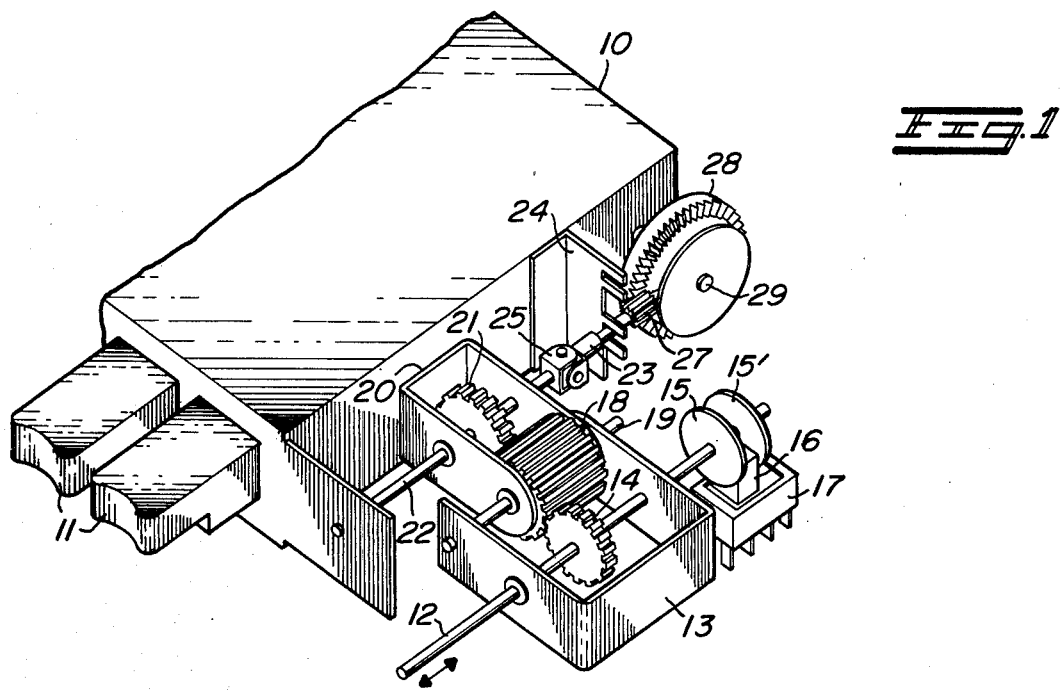
Fig. 1
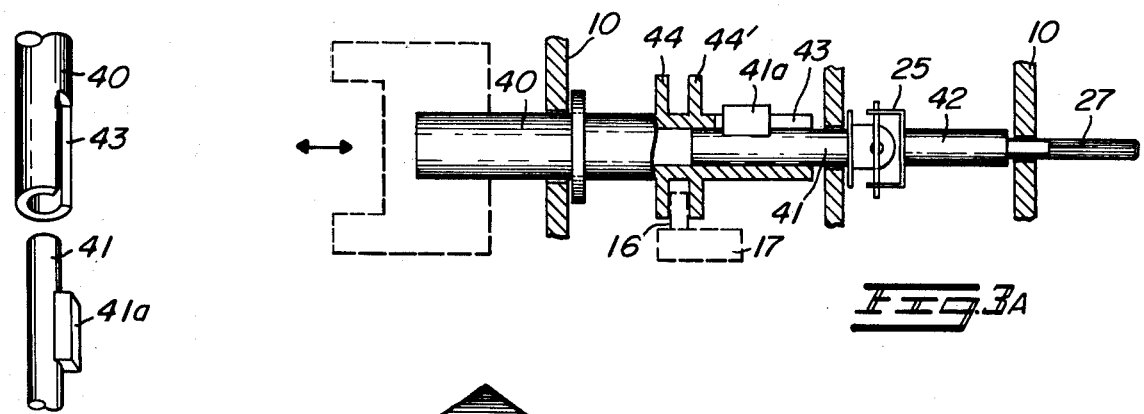
Fig. 3B
Fig. 3A
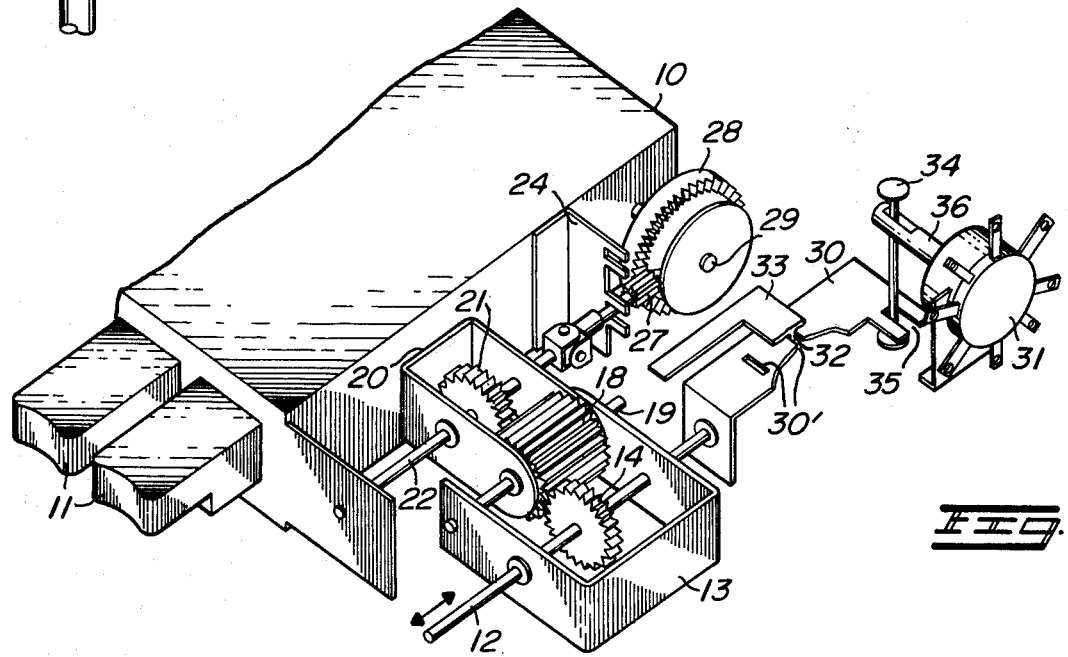
Fig. 2

CHANGE-OVER SWITCH MECHANISM FOR PUSH-BUTTON TUNER

BACKGROUND OF THE INVENTION

This invention is related generally to the field of change-over switch mechanisms for a push-button tuner and more particularly to the use of such mechanisms in a push-button tuned radio.

Prior push-button tuners use two separate controls to provide a change-over switch function and a tuning function. Such prior tuners are commonly used in AM-FM car push-button radios.

SUMMARY OF THE INVENTION

It is an object of the present invention to provide a switch change-over function to a tuning shaft and thereby improve the operability and increase the various control functions of a push-button tuner.

In an embodiment of the present invention there is provided: a change-over switch mechanism for use in a push-button tuner in which the in and out positions of a core in a coil tuner are controlled by the rotational movement of a crown gear engaged with a pinion shaft, said switch mechanism comprising; a frame, a tuning shaft means for transmitting rotational movement to the pinion shaft, said tuning shaft being rotatably and axially slidably mounted on said frame, and a switch means mounted for actuation by the sliding axial movement of said tuning shaft means.

BRIEF DESCRIPTION OF THE DRAWINGS

For a more complete understanding of the invention reference should be made to the drawings, in which:

FIG. 1 is a simplified perspective view showing one embodiment of a principal part of a push-button tuner constructed in accordance with the present invention;

FIG. 2 is a simplified perspective view showing another embodiment of a tuner constructed according to the invention; and FIGS. 3A and 3B are a side partial cross-sectional view and a perspective view, respectively, showing the principal parts of a further embodiment of a tuner according to the present invention.

DESCRIPTION OF THE PREFERRED EMBODIMENTS

Referring now to FIG. 1, there is shown a frame 10 of a push-button radio tuner and station-selecting push buttons 11 mounted on the frame 10. Although not shown, a push lever (treadle bar) on which the push buttons 11 are mounted is moved within the frame in a known manner to thereby cause, by a transmission member, the movement of a core in a coil tuner mounted inside of the frame 10 and thereby select a desired station. The tuner may be present so as to receive a desired station in response to the actuation of the push buttons 11 by releasing a restriction plate attached to the push buttons and turning a tuning shaft 12, subsequently described, so that the transmission member may be located in the position corresponding to the desired station. Push-button tuners which operate in the manner just described are well known in the prior art and are commonly used in automobile radios.

The tuning shaft 12 is shown rotatably and axially slidably supported on a U-shaped bracket 13 and outwardly extending through the bracket 13. The shaft 12 has a toothed wheel 14 fastened to it between the arms of the bracket 13 and has disc flanges 15 and 15' secured to one end of the shaft 12. An actuation arm 16 on a switch 17 is sandwiched and held between the flanges 15 and 15'. The switch 17 is an antenna change-over switch which is designed so that either a receiving mode for a zone of high electrical field intensity or a receiving mode for a zone of low electrical field intensity may be selected.

An intermediate gear 18, having an extended axial width, is shown engaged with the gear 14. The intermediate gear 18 being secured to a rotary shaft 19 rotatably mounted between U-shaped bracket 13 and an inner U-shaped bracket 20. The shaft 19 is mounted parallel to the shaft 12. A gear 21 is shown rotatably engaged with the intermediate gear 18, the gear 21 being secured to a shaft 22 rotatably mounted to the bracket 20 and the frame 10. A pinion shaft 23 is shown rotatably supported on a support frame 24, the pinion shaft being connected to the rotary shaft 22 through a universal joint 25. At one end of the pinion shaft 23 there is provided a pinion 27 integral therewith, the pinion 27 being operatively engaged with a crown gear 28 secured to a shaft 29 rotatably disposed on the frame 10. It is contemplated that the crown gear 28 will rotate to move the core of a coil tuner by moving a transmission member attached to the shaft 29. It is understood that the brackets 13 and 20 and the support frame 24 are secured to the frame 10 by suitable means.

With the construction as described above, the rotation of the tuning shaft 12 during a tuning operation is transmitted by the gears 14, 18, and 21, the pinion shaft 23, and the crown gear 28 for accomplishing the desired tuning operation. By axial movement of the tuning shaft 12, the flanges 15 and 15' will control the switch 17 and thereby effect the selection of an antenna circuit for either a high or low electric field intensity receiving zone.

It should be noted that the gear 14 is always maintained in engagement with the intermediate gear 18 irrespective of the axial position of the tuning shaft 12. Manual tuning operation is accomplished by the tuning shaft 12 regardless of the state of the switch 17. In addition, the number of teeth on the gears 14, 18 and 21 may suitably be selected so that a reduced rotation of the tuning shaft 12 may be required in order to rotate the pinion shaft 23 a predetermined amount.

FIG. 2 shows another embodiment of the present invention. FIG. 2 is identical to FIG. 1 except that the flanges 15 and 15' and the switch 17 have been replaced by a lever 30 mounted on the end of the tuning shaft 12 to operate a rotary switch 31. The lever 30 has holes 30' made therein into which a projection 32 on a leaf spring 33 will be received so as to provide fixed positions for the axial movement of the tuning shaft 12. In addition, a pin 34 is engaged in a cut stop 35 on one end of the lever 30, the other end of the lever being fastened to the tuning shaft 12. A rotary shaft 36 of the rotary switch 31 is attached to the pin 34. When the tuning shaft 12 is moved in an axial direction, the pin 34 is rotated about the axis of the shaft 36 by the lever 30 and thereby actuates the rotary switch 31 by rotating the shaft 36.

FIGS. 3A and 3B show further embodiments of the present invention. Components which are common to FIGS. 3A, 3B, and FIG. 1 have been given identical numbers. A tuning shaft 40 is a hollow shaft axially slidably and rotatably mounted on the frame 10. A rotary shaft 41 with a crank shaft 42 is rotatably mounted on the frame 10 and connected to the shaft 40 to form a so-called spline coupling. The shaft 41 has a projection 41a which is received in a slot groove 43 in the tuning shaft 40. The tuning shaft 40 is slidable relative to the rotary shaft 41 but always rotates integrally with the rotary shaft 41. In this manner, when the tuning shaft 40 is axially moved, the actuation of the arm 16 of an antenna circuit switch 17, which is sandwiched and held between discs 44 and 44' which are integral to the tuning shaft 40, will be moved and thereby accomplish the actuation of the change-over switch 17.

While the switches 17 and 31 have been described as antenna circuit changing-over switches, this invention is not limited to the use of such switches. The present invention may be employed for many purposes, such as changing-over switches between MONO and STEREO for FM radios, and band changing-over switches between FM and AM.

From the foregoing, it will be appreciated that the tuning shaft is slidably and rotatably disposed so that the switch change-over is accomplished by the sliding movement of the tuning shaft. Therefore, the controls of a push-button tuner can perform an increased number of functions. Moreover, since the switch change-over and the tuning operation can be made by sliding and rotational movement of the tuning shaft, respectively, the present invention provides a push-button tuner which is operable and well-suited for a car radio or the like.

While I have shown and described specific embodiments of this invention, further modifications and improvements will occur to those skilled in the art. All such modifications which retain the basic underlying principles disclosed and claimed herein are within the scope of this invention.

I claim:

1. A change-over switch mechanism for use in a push-button tuner in which the in and out positions of a core in a coil tuner are controlled by the rotational movement of a crown gear engaged with a pinion shaft, said switch mechanism comprising;
   a frame,
   a tuning shaft,
   tuning means for transmitting all manual rotational movement of said tuning shaft to the pinion shaft,
   said tuning shaft being rotatably and axially slidably mounted on said frame and extending through said frame for direct manual rotational and axial control thereof, and
   a switch means mounted for actuation by the sliding axial movement of said tuning shaft, said rotational movement of said tuning shaft being transmitted to the pinion shaft regardless of the axial position of said tuning shaft,
   said tuning means including a toothed wheel means rigidly attached to said tuning shaft for transmitting the rotation movement of said tuning shaft to a gear mounted at a fixed axial position with respect to said frame, said gear and toothed wheel means being dimensioned such that said gear and toothed wheel means are in engagement regardless of the axial position of said tuning shaft.

2. A change-over switch mechanism for use in a push-button tuner in which the in and out positions of a core in a coil tuner are controlled by the rotational movement of a crown gear engaged with a pinion shaft, said switch mechanism comprising;
   a frame,
   a tuning shaft,
   tuning means for transmitting all manual rotational movement of said tuning shaft to the pinion shaft,
   said tuning shaft being rotatably and axially slidably mounted on said frame and extending through said frame for direct manual rotational and axial control thereof,
   a switch means mounted for actuation by the sliding axial movement of said tuning shaft, said rotational movement of said tuning shaft being transmitted to the pinion shaft regardless of the axial position of said tuning shaft, and
   flange means rigidly attached to said tuning shaft for transmitting the axial movement of said tuning shaft to said switch means for actuation thereof,
   one of said tuning shaft and tuning means including an outer hollow shaft having a slot opening and the other of said tuning shaft and tuning means including an inner shaft having a projection, said inner shaft co-axially and slidably mounted within said outer shaft with said projection located within said slot opening regardless of the axial position of said hollow shaft.

3. A change-over switch mechanism according to claim 2 wherein said flange means is rigidly attached to said outer hollow shaft and said outer hollow shaft being said tuning shaft.

4. A change-over switch mechanism according to claim 3 wherein said inner shaft is mounted at a fixed axial position with respect to said frame.

5. A change-over switch mechanism for use in a push-button tuner in which the in and out positions of a core in a coil tuner are controlled by the rotational movement of a crown gear engaged with a pinion shaft, said switch mechanism comprising;
   a frame,
   a shaft,
   tuning means for transmitting all manual rotational movement of said tuning shaft to the pinion shaft,
   said tuning shaft being rotatably and axially slidably mounted on said frame and extending through said frame for direct manual rotational and axial control thereof,
   a switch means mounted for actuation by the sliding axial movement of said tuning shaft, said rotational movement of said tuning shaft being transmitted to the pinion shaft regardless of the axial position of said tuning shaft, and
   means attached to said tuning shaft for transmitting the axial movement of said tuning shaft to said switch means for actuation thereof,
   said switch means including a rotary switch having a rotary shaft rotatable about an axis, said axial transmitting means translating the axial movement of said tuning shaft into a rotational movement of said rotary shaft.

6. A change-over switch mechanism according to claim 5 wherein said axial transmitting means includes a pin coupled to said rotary shaft and rotated about the axis of said rotary shaft by the axial movement of said tuning shaft, said pin rotation causing the rotation of said rotary shaft.

7. A change-over switch mechanism according to claim 6 wherein said flange means includes means with indentations and at least one projection for providing a plurality of relatively fixed axial positions for said tuning shaft.

8. A change-over switch mechanism according to claim 7 wherein said fixed axial position means includes a lever arm having holes and a leaf spring having a projection.

* * * * *

UNITED STATES PATENT AND TRADEMARK OFFICE
CERTIFICATE OF CORRECTION

PATENT NO. : 4,015,096
DATED : MARCH 29, 1977
INVENTOR(S) : KAZUMASA FUJITA

It is certified that error appears in the above-identified patent and that said Letters Patent are hereby corrected as shown below:

After the colon following the word assignee in item [73] on the cover page of the patent:

Please delete "Motorola, Inc., Schaumburg, Illinois" and insert --ALPS Motorola, Inc., Tokyo, Japan.

Signed and Sealed this

Thirteenth Day of December 1977

[SEAL]

Attest:

RUTH C. MASON
Attesting Officer

LUTRELLE F. PARKER
Acting Commissioner of Patents and Trademarks